US 9,689,933 B2

(12) United States Patent
Wen et al.

(10) Patent No.: US 9,689,933 B2
(45) Date of Patent: Jun. 27, 2017

(54) MAGNETIC FIELD SENSOR

(71) Applicant: SAGATEK CO., LTD., Taipei (TW)

(72) Inventors: Kuei-Ann Wen, Hsinchu (TW);
Tai-Wei Chiang, New Taipei (TW)

(73) Assignee: Sagatek Co., Ltd., Taipei (TW)

( * ) Notice: Subject to any disclaimer, the term of this patent is extended or adjusted under 35 U.S.C. 154(b) by 357 days.

(21) Appl. No.: 14/662,891

(22) Filed: Mar. 19, 2015

(65) Prior Publication Data

US 2016/0084922 A1   Mar. 24, 2016

(30) Foreign Application Priority Data

Sep. 18, 2014   (TW) .............................. 103132219 A

(51) Int. Cl.
| G01R 27/26 | (2006.01) |
| G01R 33/00 | (2006.01) |
| G01R 33/02 | (2006.01) |
| G01R 33/028 | (2006.01) |
| G01P 15/135 | (2006.01) |
| G01P 15/03 | (2006.01) |

(52) U.S. Cl.
CPC ..... *G01R 33/0286* (2013.01); *G01R 33/0206* (2013.01)

(58) Field of Classification Search
CPC ...... G01R 33/00; G01R 33/02; G01R 33/028; G01R 27/26; G01P 15/03; G01P 15/135
See application file for complete search history.

(56) References Cited

U.S. PATENT DOCUMENTS

| 6,215,318 B1 * | 4/2001 | Schoefthaler ...... G01R 33/0035 324/658 |
| 8,390,283 B2 | 3/2013 | Mather et al. |
| 8,637,943 B1 | 1/2014 | Yang |
| 2012/0007597 A1 | 1/2012 | Seeger et al. |

FOREIGN PATENT DOCUMENTS

WO   WO 2013 159584   10/2013

* cited by examiner

*Primary Examiner* — Arleen M Vazquez
*Assistant Examiner* — Neel Shah
(74) *Attorney, Agent, or Firm* — Muncy, Geissler, Olds & Lowe, P.C.

(57) ABSTRACT

A magnetic field sensor, comprising a suspending mass block, a group of Y direction displacement sensors, a group of Z direction displacement sensors and a power supply; wherein the mass block, the Y direction displacement sensors and the Z direction displacement sensors respectively comprise a plurality of metal layers and a dielectric layer between two metal layers. In the mass block, a region corresponding to the Y direction displacement sensors and a region corresponding to the Z direction displacement sensors respectively comprise at least two metal layers connected by a via. The Y direction displacement sensors include two electrodes, each comprising at least two metal layers connected by a via; the Z direction displacement sensor includes two electrodes, each comprising at least two metal layers connected by a via; and the power supply provides a current flowing through the mass block selectively in X or Y direction.

20 Claims, 5 Drawing Sheets

MAGNETIC FIELD SENSOR

FIELD OF THE INVENTION

The present invention relates to a micro magnetic field sensor, and in particular to a micro magnetic field sensor capable of measuring magnetism in three axes simultaneously.

BACKGROUND OF THE INVENTION

A micro magnetic field sensor is an element widely applied to, for example, smart phones, wearable devices and Internet of Things (IOT) devices. The micro magnetic field sensor may also be applied to other fields of engineering, science, and industry. For providing a function of magnetic measurement on a modern application, the micro magnetic field sensor has to be highly integrated, have low power consumption, and provide correct magnetic force/magnetic field measurement.

In various micro magnetic field sensors, the magnetic field sensor operating on the principle of the Lorentz forces is practical. The reason is that this kind of micro magnetic field sensor can be manufactured in a standard CMOS process. Most new micro magnetic field sensor structures operate using the principle of the Lorentz forces.

A magnetic field sensor using the Lorentz forces substantially comprises a mass block which is suspended on a structure or a substrate via a spring. When a certain current is applied to the mass block, the current and magnetic forces existing in the earth magnetic field or generated by other magnetic objects generate the Lorentz forces, that move the mass block in a direction perpendicular to the current direction and the magnetic force direction. An electrode for detection forms generally in a comb or finger shape which is staggered with a comb or finger shape formed by an edge of the mass block and maintained at intervals; and the space therebetween is equivalent to a capacitor. The electrode for detection can detect a change in capacitance due to a change in the relative position between the mass block and the electrode for detection caused by the movement of the mass block, and generate a detection signal. The detection signal is converted into a voltage form as an output signal. The generated output signal represents a displacement direction and a displacement amount of the mass block under the influence of the magnetic force, and a value of the magnetic force can be calculated on this basis.

Since most of the known micro magnetic field sensors are manufactured by an MEMS or CMOS process with a very small size, they can only provide single direction magnetism measurement. The industry has proposed several designs capable of measuring coplanar two-direction magnetism with a single magnetic field sensor. However, this kind of design cannot measure magnetism in a third direction perpendicular to this plane.

WO 2013159584 A1 discloses a micro-mechanical magnetic field sensor which can measure magnetism in two directions of X and Y simultaneously. However, this invention does not provide measurement of magnetism in a Z direction, i.e., perpendicular to the XY plane.

U.S. Pat. No. 8,637,943 B1 discloses a multi-axis integrated MEMS device which comprises 3 groups of magnetic field sensors to measure three-axis magnetism.

US 2012/0007597 A1 discloses a micro-mechanical magnetic field sensor structure which uses a group of X/Y-axis magnetic force detectors and a group of Z-axis magnetic force detectors so as to provide three-axis magnetic force measurement. The X/Y-axis magnetic force detectors and the Z-axis magnetic force detectors are detectors of different types.

U.S. Pat. No. 8,390,283 B2 provides a three-axis magnetic field sensor which uses three groups of Wheatstone bridges consisting of magneto-resistive sensors to provide a function of three-axis magnetic force detection.

At present, a novel structure of micro magnetic field sensor is needed in the industry to provide a function of three-axis magnetic force detection.

Meanwhile, a novel micro magnetic field sensor structure is also needed to provide a function of three-axis magnetic force detection using a single mass block.

Meanwhile, it is also necessary to provide a magnetic field sensor capable of integrating a three-axis magnetic force measurement function in a single mass block by taking the advantages of the standard CMOS process.

OBJECTIVES OF THE INVENTION

The present invention provides a magnetic field sensor capable of measuring magnetic force in all three axes using a single mass block.

The present invention also provides a magnetic field sensor integrating a three-axis magnetic force measurement function in a single mass block taking the advantages of the standard CMOS process.

SUMMARY OF THE INVENTION

A magnetic field sensor according to the present invention comprises a suspending mass block, a group of Y direction displacement detection electrodes, a group of Z direction displacement detection electrodes, and a power supply module. The Y direction represents one of two orthogonal directions of a plane where the mass block is arranged and the Z direction represents a direction perpendicular to the plane. A longitudinal direction of the mass block is parallel to the Y direction. The mass block comprises a plurality of metal layers and a plurality of dielectric layers, with the dielectric layers and metal layers stacking with each other. The Y direction displacement detection electrodes and the Z direction displacement detection electrodes respectively comprise a plurality of metal layers and a dielectric layer between any two metal layers. In the mass block, a portion corresponding to the Y direction displacement detection electrodes comprises at least two metal layers connected by a via and a portion corresponding to the Z direction displacement detection electrodes comprises at least two metal layers connected by a via. The Y direction displacement detection electrodes comprise two groups of electrodes, each group comprising at least two metal layers connected by a via. The Z direction displacement detection electrodes also comprise two groups of electrodes, each group comprising at least two metal layers connected by a via. The power supply module provides a current flowing through the mass block. The via may be filled up by metal material. In the mass block, the portion corresponding to the Y direction displacement detection electrodes and the portion corresponding to the Z direction displacement detection electrodes may be in different planes or in a same plane. If they are in the same plane, the two portions are electrically insulated from each other.

The magnetic field sensor may also comprise a detection circuit for calculating magnetism in three directions of X, Y and Z, according to a power supply state of the power supply module, a direction of the current from the power supply module flowing through the mass block and an output of the Y direction displacement detection electrodes or the Z direction displacement detection electrodes. The X direction is a direction in a plane where the mass block is arranged and perpendicular to the Y direction.

In several preferred examples of the present invention, the mass block, the Y direction displacement detection electrodes and the Z direction displacement detection electrodes are formed integrally in a structure comprising a plurality of metal layers and a plurality of dielectric layers staggered sequentially. The mass block is separated, at an interval of space, from the Y direction displacement detection electrodes and the Z direction displacement detection electrodes. In this example, the Y direction displacement detection electrodes and the Z direction displacement detection electrodes respectively form, at one side adjacent to the mass block, finger extensions extending in the X/Y plane and the mass block also forms, at a side adjacent to the Y direction displacement detection electrodes and the Z direction displacement detection electrodes, finger extensions which extend in the X/Y plane and into recesses formed by the finger extensions of the Y direction displacement detection electrodes and the Z direction displacement detection electrodes.

In the above-mentioned embodiment, the Y direction displacement detection electrodes are located in first and second metal layers of the structure. In this example, a first sub-group of electrodes of the Y direction detection electrodes may comprise a plurality of finger electrodes and a second sub-group of electrodes also comprises a plurality of finger electrodes, with finger electrodes of the two sub-groups being arranged in a staggered configuration, such that a finger electrode pair including a finger electrode of the first sub-group of electrodes and a finger electrode of the second sub-group of electrodes corresponds to one of finger extensions of the mass block. In a preferred example, the magnetic field sensor comprises two sets of Y direction displacement detection electrodes, each set comprising two sub-groups of electrodes, both located in the first and second metal layers of the structure. Preferably, the first and second metal layers of each group of electrodes of the Y direction displacement detection electrodes are connected by a via.

In the above-mentioned example, the Z direction displacement detection electrodes are respectively located in a third and a fourth metal layers and in a fifth and a sixth metal layers of the structure; with the third and fourth metal layers and the fifth and sixth metal layers being located at different heights in the Z direction. In a preferred example, the magnetic field sensor comprises two sets of Z direction displacement detection electrodes, each set comprising two sub-groups of electrodes respectively located in the third and fourth metal layers and in the fifth and sixth metal layers of the structure; the third and fourth metal layers are located above the fifth and sixth metal layers. That is, the first sub-group of electrodes of the first set of Z direction displacement detection electrodes and the first sub-group of electrodes of the second set of Z direction displacement detection electrodes are located in a same plane, and the second sub-group of electrodes of the first set of Z direction displacement detection electrodes and the second sub-group of electrodes of the second set of Z direction displacement detection electrodes are located in a same plane. The first and second metal layers and the third to sixth metal layers maintain a predetermined distance therebetween with at least one dielectric layer.

In the above-mentioned example, preferably, the third and fourth metal layers of the Z direction displacement detection electrodes are connected by a via and the fifth and sixth metal layers are also connected by a via. The via may be filled with metal material. Moreover, the first and second metal layers of the mass block may also be connected by a via and the fourth and fifth metal layers are connected by a via. The via may be filled with metal material. The two sets of Y direction displacement detection electrodes may be located at two sides of the mass block in the X direction and the two sets of Z direction displacement detection electrodes are also located at two sides of the mass block in the X direction.

The mass block provides at least four contacts for electrical connection to the power supply module, so that the current provided by the power supply module may flow through the mass block selectively in the X or Y direction.

The detection circuit is connected to the power supply module and the groups of electrodes of the Y direction displacement detection electrodes and the Z direction displacement detection electrodes, so as to detect in synchronization with the operation of the power supply module a change in capacitance between the Y direction displacement detection electrodes and the portion of the mass block corresponding to the Y direction displacement detection electrodes, to determine a Y direction displacement amount of the mass block under the action of a magnetic field; and to detect in synchronization with the operation of the power supply module a change in capacitance between the Z direction displacement detection electrodes and the portion of the mass block corresponding to the Z direction displacement detection electrode, to determine a Z direction displacement amount of the mass block under the action of a magnetic field. The detection circuit may further calculate magnetism of the magnetic field in respective X/Y/Z directions according to the flowing direction of the current and the Y/Z direction displacement amount.

In a preferred example of the present invention, when the power supply module applies an X direction current to the mass block, the detection circuit measures a Z direction displacement amount of the mass block and calculates the Y direction magnetic force on the mass block on this basis; when the power supply module applies a minus X direction current to the mass block, the detection circuit measures a Y direction displacement amount of the mass block and calculates the Z direction magnetic force on the mass block on this basis; and when the power supply module applies a Y direction current to the mass block, the detection circuit measures a Z direction displacement amount of the mass block and calculates the X direction magnetic force on the mass block.

DETAILED DESCRIPTION OF THE INVENTION

The present invention will be described below according to its preferred examples, it should make appreciated that preferred examples of the present invention are only given to illustrate preferred embodiments of the present invention. The scope of the present invention is not limited to the examples disclosed in the description.

Figure 1:
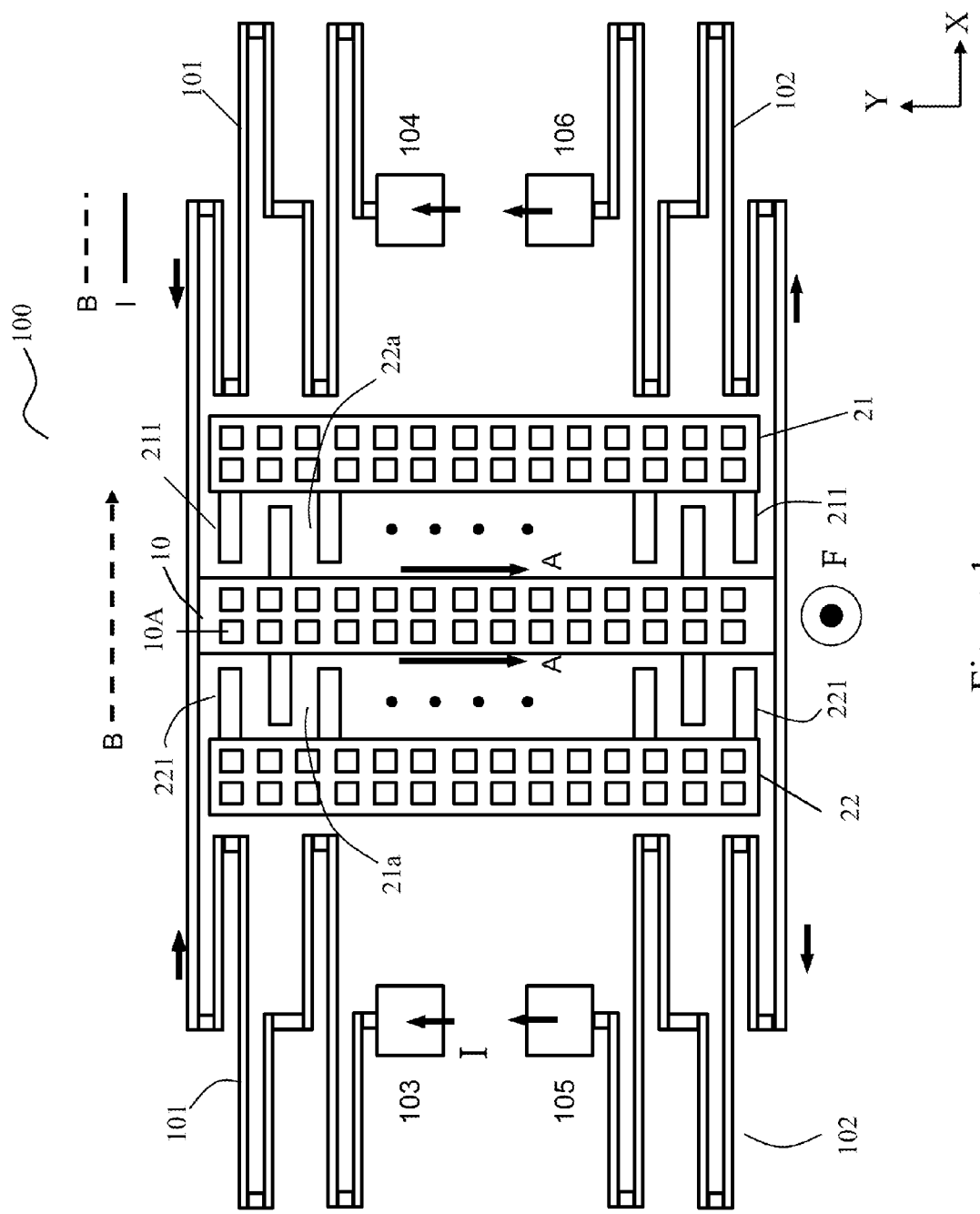
FIG. 1 shows a plan view of a magnetic field sensor structure manufactured according to the present invention.

FIG. 1 shows a plan view of a magnetic field sensor structure manufactured according to the present invention. As shown in this figure, a magnetic field sensor structure 100 comprises a mass block 10 and two groups of finger electrode structures 21, 22 at two sides of the mass block 10. The mass block 10 and two groups of finger electrode structures 21, 22 shown in the figure are structures manufactured by a standard CMOS process. The mass block 10 and the two groups of finger electrode structures 21, 22 are electrically insulated at intervals by a space 21A, 22A, respectively. If the structural body is manufactured by a standard CMOS process, the two groups of finger electrode structures 21, 22 may include 6 metal layers and a dielectric layer between two metal layers and on the top and below the bottom layers, all arranged on a substrate (not shown). A plurality of finger electrodes 211, 221 extends in the X direction in the figure from the plane where the two groups of finger electrode structures 21, 22 are arranged. In the following description, when the extension direction of the finger electrode plates 211, 221 is X direction, the direction in the same plane and perpendicular to the X direction is Y direction, as illustrated by the coordinates in the figure. The direction perpendicular to the plane is referred to as Z direction.

The mass block 10 is located in a structure defined by the two groups of finger electrode structures 21, 22. In the example shown in the figure, the mass block 10 has a rectangular body, with a length direction parallel to the Y direction. If the structural body is manufactured by the standard CMOS process, the mass block 10 may comprise metal layers in a number less than the metal layers of the two groups of finger electrode structures 21, 22, e.g., 6 layers, and a dielectric layer between any two of the metal layers and on the top and below the bottom layers, and suspends on the substrate. The space between the mass block 10 and the substrate and the space 21A, 22A between the mass block 10 and the two groups of finger electrode structures 21, 22 are formed by a standard CMOS process, e.g., formed by etching. For forming this space, etch windows 10A and 10A might have to be fabricated in the mass block 10 to facilitate processing. However, the etch windows 10A and 10A are not any technical limitations. For maintaining suspension of the mass block 10, the mass block 10 is fixed to the structural body 100 by springs 101, 102. A plurality of finger extensions extends from two sides of the mass block 10 in the X direction and into a space formed by any two finger extensions of the finger electrode plates 211, 221 of the finger electrode structures 21, 22 and maintains a certain distance from the finger electrode plates 211, 221.

Figure 4:
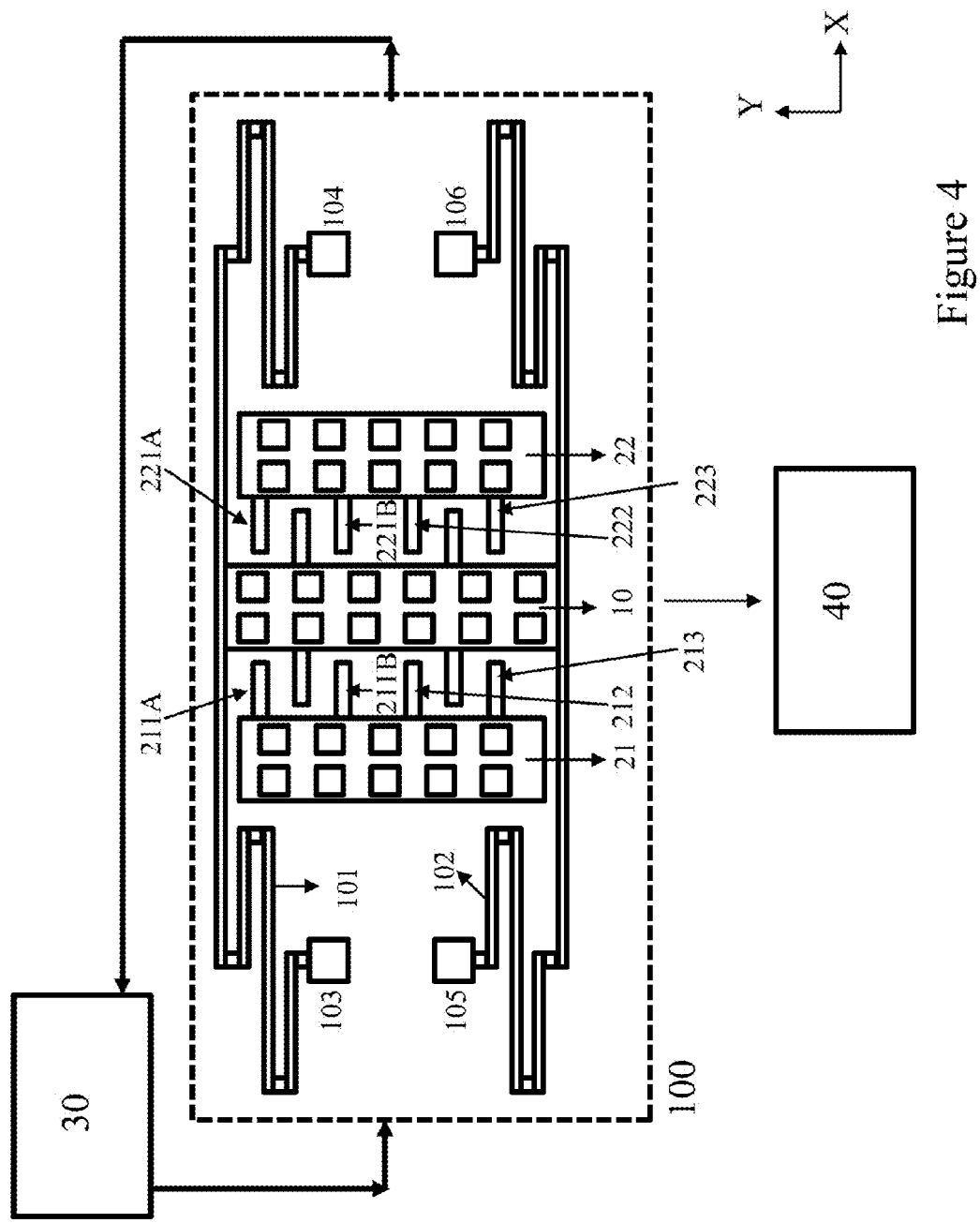
FIG. 4 shows a schematic view of a magnetic field sensor of the present invention.

The support springs 101, 102 of the mass block 10 are connected to an electrical contact 103, 104, 105, 106 at the end apart from the mass block 10, so that currents provided by an external power source, e.g., the power supply module 30 in FIG. 4 may flow through the mass block 10 selectively in the X or Y direction via the electrical contacts 103, 104, 105, 106. In other words, if the current flows in via contacts 103, 104, it flows through the springs 101, 101, then through the mass block 10 in a negative Y direction, and then to contacts 105, 106 via the support springs 102, 102, shown as arrows A in the figure. On the other hand, if the current flows in via contacts 103, 105, it flows through the mass block 10 in the X direction, and then out via contacts 104, 106, shown as arrows B in the figure. Moreover, if the current flows in via contacts 104, 106, it flows through the mass block 10 in a negative X direction, and then out via contacts 103, 105.

A magnetic field sensor having the above-mentioned architecture can measure a magnetic field at a specific site by means of measurement of the Lorentz force. According to the Lorentz Force Law, when a current with a certain intensity is applied to a mass block, the applied current and the magnetic force existing on the earth will generate the Lorentz force. The generated Lorentz force may move the mass block to a direction perpendicular to both the current direction and the magnetic force direction. For example, in the example as shown in the figure, when the current is flowing through the mass block 10 in a negative Y direction in the figure, the magnetic force in the X direction in the figure will pull the mass block 10 to a direction away from the page (the positive Z direction). Thus, by calculating a Z direction displacement amount of the mass block after providing a constant current in the negative Y direction, the X direction magnetism can be measured.

On the other hand, when an X direction constant current is applied to the mass block, the Y direction magnetic force will pull the mass block 10 to the positive Z direction in the figure. Thus, by calculating a Z direction displacement amount of the mass block after providing a constant current in the X direction, the Y direction magnetism can be measured. On the other hand, when an X direction constant current is applied to the mass block, the Z direction magnetic force will pull the mass block 10 to the negative Y direction in the figure. Thus, by calculating a Y direction displacement amount of the mass block after providing a constant current in the X direction, the Z direction magnetism can be measured.

Figure 2:
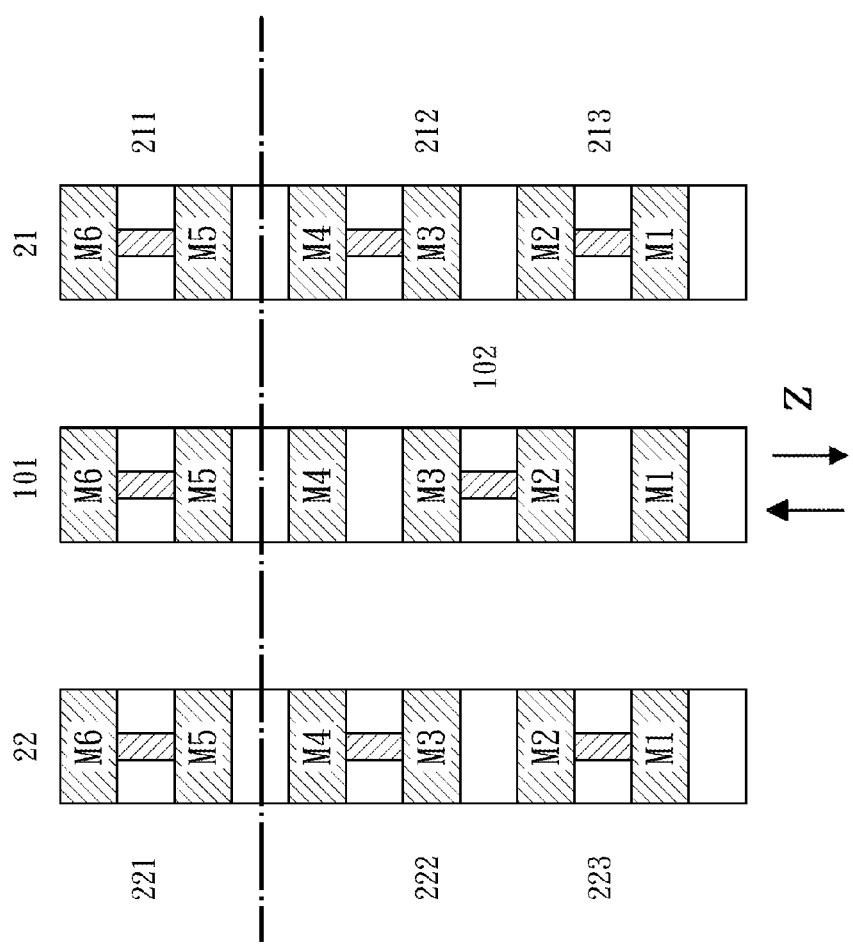
FIG. 2 shows a schematic diagram of an electrode structure according to an embodiment of the present invention.

For providing effective measurement for the movement amounts in the X/Y and Z directions of the mass block 10, a preferred example of the present invention forms electrodes required in the measurement of mass block displacement amount by means of connecting two adjacent metal layers by a via. That is, the common electrodes in the mass block 10 and the Y direction displacement measurement electrodes and Z direction displacement measurement electrodes in the finger electrode structures 21, 22 all include two adjacent metal layers connected by a via. FIG. 2 shows a schematic diagram of an electrode structure according to an embodiment of the present invention. In the embodiment as shown in the figure, the finger electrode structures 21, 22 are located at two sides of the mass block 10. The first and second metal layers (M5, M6) of the mass block 10 are connected by a via to form an electrical connection. The fourth and fifth metal layers (M2, M3) are also connected by a via to form an electrical connection. Meanwhile, the first and second metal layers (M5, M6) of the finger electrode structures 21, 22 are connected by a via to form an electrical connection. The third and fourth metal layers (M3, M4) and the fifth and sixth metal layers (M1, M2) are also respectively connected by a via to form respective electrical connections. If necessary, each via can be filled with metal.

Figure 3:
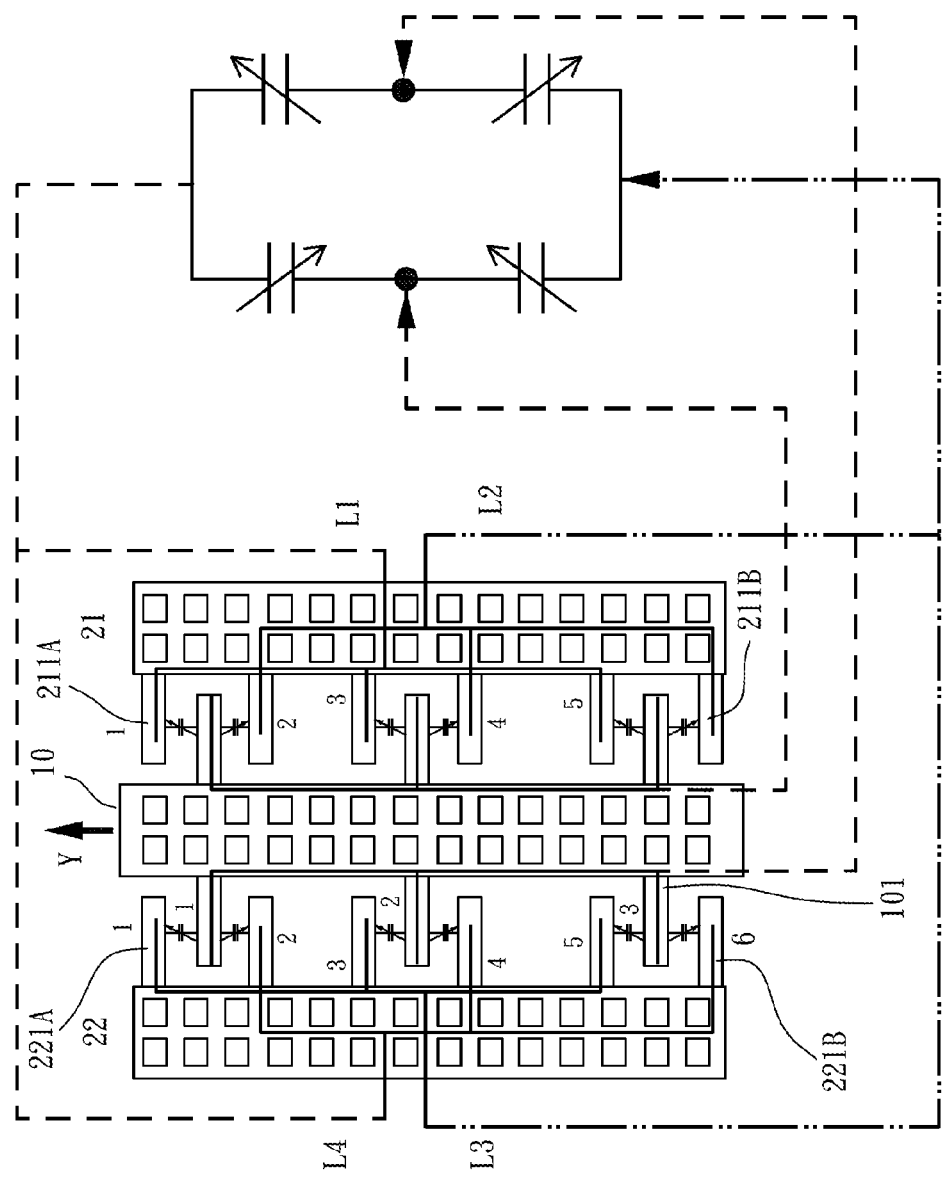
FIG. 3 shows a plan view of an electrode structure according to the embodiment of FIG. 2 and illustrates a structure of Y direction displacement detection electrodes 211A, 211B, 221A and 221B.

In the above-mentioned architecture, the M5/M6 metal layers of the finger electrode structures 21, 22 in the figure form Y direction displacement detection electrodes 211A, 211B, 221A, 221B of the finger electrode structures 21, 22. The electrodes 211, 221 are fixed to the finger electrode structures 21, 22 and are stationary. FIG. 3 shows a plan view of an electrode structure according to an embodiment of the present invention and illustrates a structure of the Y direction displacement detection electrodes 211A, 211B, 221A and 221B. As shown in the figure, electrodes 211A, 211A form the first sub-group of electrodes of the first set of Y direction detection electrodes and electrodes 211B, 211B form the second sub-group of electrodes of the first set of the Y direction detection electrode. Electrodes 221A, 221A form the first sub-group of electrodes of the second set of the Y direction detection electrode and electrodes (221B, 221B) form the second sub-group of electrodes of the second set of the Y direction detection electrode. Electrodes of the same sub-group are electrically connected and are electrically insulated from electrodes of other sub-groups. Lines (L1, L2, L3, L4) in the figure show electrical connections among the components, which are not necessarily their physical connections. The electrodes of each sub-group may form a connection or insulation by means of conductive lines formed in different metal layers. For example, electrodes 211A, 211A of the first sub-group of the first set of the Y direction detection electrodes may use the first metal layer M6 as their conductive lines and electrodes 211B, 211B of the second sub-group may use the second metal layer M5 as their conductive lines. And so on. The electrodes of each sub-group are further connected to a detection circuit 40 (see FIG. 4) by conductive lines in the same manner.

As shown in FIG. 2, the M5/M6 metal layers of the mass block 10 form a common electrode 101 and are moveable by the Lorentz force applied to the magnetic field sensor. The component of this movement in the Y direction (direction of arrow Y in FIG. 3, i.e., Y direction in FIG. 1) will change respective distances between the common electrode 101 and the first sub-group of electrodes 211A, 221A and between the common electrode 101 and the second sub-group of electrodes 211B, 221B, both of the Y direction displacement detection electrodes, so as to change the respective capacitances between the common electrode 101 and the sub-groups of electrodes of the Y direction displacement detection electrodes accordingly. The amount of change is detected by the Y direction displacement detection electrodes 211A, 211B, 221A, 221B and then transferred to the next stage, i.e., the detection circuit 40 (FIG. 4) to convert same into a voltage signal, for example, and the Y direction displacement amount is calculated on this basis.

By the same way, the M3/M4 and M1/M2 metal layers of the finger electrode structures 21, 22 in FIG. 2 respectively form Z direction displacement detection electrodes 212, 213 and 222, 223 of the finger electrode structures 21, 22. The electrodes 212, 213 and 222, 223 are fixed to the finger electrode structures 21, 22 and are stationary. The M2/M3 metal layers of the mass block 10 form a common electrode 102, which is moveable by the Lorentz force applied to the magnetic field sensor. The component of this movement in the Z direction (the direction of arrow Z direction in FIG. 2) will change the respective distances between the common electrode 102 and the Z direction displacement detection electrodes 212, 213 and 222, 223, so as to change capacitances between the common electrode 102 and the Z direction displacement detection electrodes 212, 222 and between the common electrode 102 and the Z direction displacement detection electrodes 213, 223 accordingly. The amount of change is detected by the Z direction displacement detection electrodes 212, 213 and 222, 223 and then transferred to the next stage, i.e., the detection circuit 40 (FIG. 4) to convert same into a voltage signal, for example, and the Z direction displacement amount is calculated on this basis.

In this embodiment, the Y direction displacement detection electrodes include two sets, i.e., a first set of electrodes 211A, 211B and a second set of electrodes 221A, 221B respectively located at two sides of the mass block 10 in the X direction. The Z direction displacement detection electrodes also include two sets, i.e., a first set of electrodes 212, 213 and a second set of electrodes 222, 223, also located at two sides of the mass block 10 in the X direction. However, a person skilled in the art would appreciate that generally it only needs to include one set of these detection electrodes. Moreover, it is practical to use more than two sets.

Although the above-mentioned structures use specific metal layers as the detection electrodes and common electrodes, a person skilled in the art would appreciate that in a standard CMOS structure, any combination of metal layers may be used as the detection electrodes and common electrodes of the present invention, which is not limited by the manners as shown in the embodiments. Moreover, the magnetic field sensor structure of the present invention also is not limited to that manufactured by the standard CMOS process; any manufacturing method forming a stacked structure of metal layers and dielectric material layers can be used to manufacture the magnetic field sensor of the present invention. In addition, in the above-mentioned embodiments, the X/Y direction displacement detection electrodes, the Z direction displacement detection electrodes and the corresponding common electrodes are not formed in a same plane. However, they may be formed in a same plane by a simple modification so as to reduce the thickness of the structure.

There is no special limitation to the material of the metal layer. Any material with good electric conductivity and suitable for processing can be used in the present invention. Suitable material includes: copper, silver, gold, aluminium and alloys thereof. There is also no special limitation to the material of the via and its filling material. Any material with good electric conductivity and suitable for processing can be applied in the present invention. Suitable material includes: copper, silver, gold, aluminium and alloys thereof. The material of the metal layer may be the same as or different from the material of the via and its filling material. The dielectric layers preferably use high dielectric material, e.g., silicon or metal oxides and their oxynitrides. There also is no special limitation in the thickness of each metal layer and dielectric layer. However, if the magnetic field sensor is manufactured by a standard CMOS process, the thickness of each metal layer and dielectric layer is preferably equal to that of the standard process specification, so as to simplify the process.

The mass block 10 is preferably suspended in the structural body by springs 101, 102. The springs 101, 102 may generally comprise several metal layers and dielectric layers between the metal layers. The material of the metal layers and dielectric layers of the springs 101, 102 is preferably the same as the material of the mass block 10 and the finger electrode structures 21, 22. However, this is also not any technical limitation. The techniques for manufacturing suspending mass blocks and finger electrode structures are well known, which will not be further described here.

FIG. 4 shows a systematic view of a magnetic field sensor according to the present invention. As shown in this figure, the magnetic field sensor comprises the above-mentioned suspending mass block 10, finger electrode structures 21, 22 at two sides of the mass block 10, a power supply module 30 for providing a current to the electrical contacts 103, 104, 105, 106 of the mass block 10, and a detection circuit 40 which connects the power supply module 30 to the detection electrodes 211A, 211B, 221A, 221B and 212, 213 and 222, 22) in the finger electrode structures 21, 22 and is used to detect displacement amounts of the mass block 10 in the Y and Z directions, when a constant current is applied as specified. The detection circuit 40 can be equipped with or externally connected to a microcontroller or a microcomputer (not shown in the figure), to calculate displacement amounts of the mass block 10 in the Y and Z directions and to convert the Y and Z direction displacement amounts into magnetism of geomagnetism or other magnetic fields in the X, Y and Z directions, with reference to the operating mode information of the power supply module 30, including the direction of the current flowing through the mass block.

Figure 5:
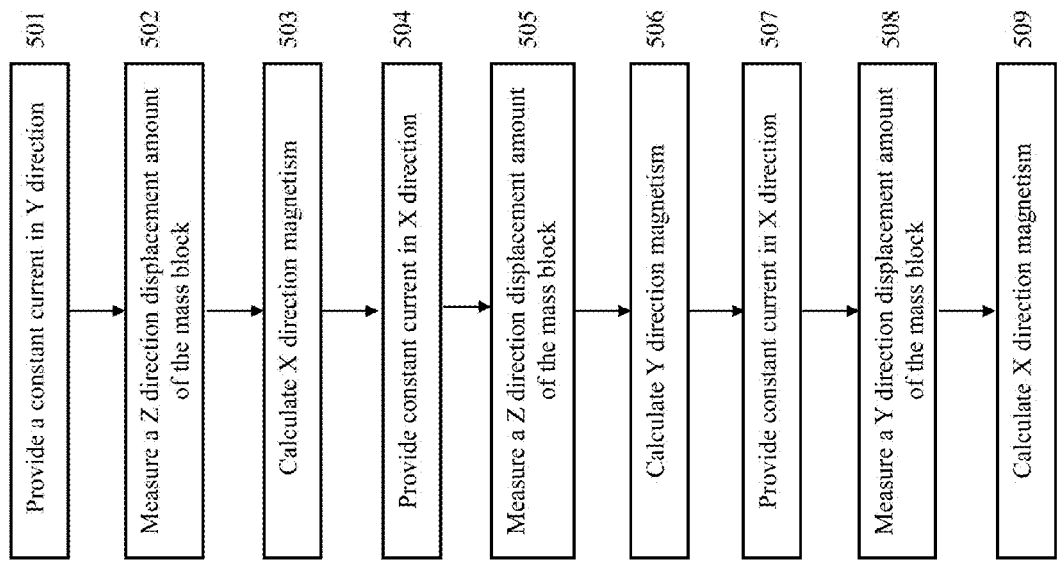
FIG. 5 illustrates a flow chart of a method for measuring magnetism in various directions using a detection circuit of the present invention.

The technique of the detection circuit 40 in calculating a magnetic field according to the displacement amount of the mass block 10 is well known. Detailed description thereof is thus omitted. In the followings, explanation is only made for the detection/calculation method that the detection circuit 40 uses in compliance with the particular design of the magnetic field sensor 100 of the present invention. FIG. 5 illustrates a flow chart of a method for measuring magnetism in various directions using a detection circuit 40 of the present invention. It should be noted that there is not any technical limitation in the sequence of the method for calculating the X, Y and Z direction magnetic forces. Calculations in different sequences may also generate correct results.

The magnetic field sensor structure may be manufactured individually and then combined with the power supply module 30 and the detection circuit 40, for example. However, it may also be manufactured in a same structural body together with circuit architectures such as the power supply module 30 and the detection circuit 40 and other mechanical architectures, so as to simplify the interfaces therebetween.

As shown in FIG. 5, when a magnetic field is measured, firstly, in step 501, the power supply module 30 is set to provide a constant current in Y direction as shown in FIG. 1 to the mass block 10. That is, the current enters the mass block 10 via contacts 103, 104 and then leaves via contacts 105, 106, or enters the mass block 10 via contacts 105, 106 and then leaves via contacts 103, 104. In step 502, after the current becomes stable, measure a Z direction displacement amount of the mass block, followed by step 503, wherein X direction magnetism is calculated, taking the Z direction displacement amount as reference.

Thereafter, in step 504, change the settings such that the power supply module 30 provides constant current in X direction as shown in FIG. 1 to the mass block 10. That is, the current enters the mass block 10 via contacts 103, 105 and then leaves via contacts 104, 106. In step 505, after the current becomes stable, measure a Z direction displacement amount of the mass block, followed by step 506, wherein Y direction magnetism is calculated, taking the Z direction displacement amount as reference.

Then, in step 507, the power supply module 30 is set to continue to provide a constant current in X direction to the mass block 10. In step 508, after the current becomes stable, measure a Y direction displacement amount of the mass block, followed by step 509, wherein Z direction magnetism is calculated, taking the Y direction displacement amount as reference. In this way, X/Y/Z three-directional magnetic field measurement is accomplished.

The three-dimensional magnetism measured using the magnetic field sensor of the present invention may be used in various applications, e.g., longitude and latitude determination and altitude determination. The present invention provides a magnetic field sensor which has a simple design, is convenient to manufacture and is completely compatible with a standard CMOS process. The magnetic field sensor can measure three-dimensional magnetism correctly using only a simple circuit control.

What is claimed is:

1. A magnetic field sensor, comprising a suspending mass block, a group of Y direction displacement detection electrodes, a group of Z direction displacement detection electrodes and a power supply module;
   wherein the Y direction represents one of two orthogonal directions of a plane where the mass block is arranged and the Z direction represents a direction perpendicular to the plane, wherein:
   the mass block has a longitudinal direction parallel to the Y direction and comprises a plurality of metal layers and a plurality of dielectric layers, with the dielectric layers and metal layers being stacked with each other;
   the Y direction displacement detection electrodes and the Z direction displacement detection electrodes respectively comprise a plurality of metal layers and a dielectric layer between any two metal layers;
   in the mass block, a portion corresponding to the Y direction displacement detection electrodes comprises at least two metal layers connected by a via and a portion corresponding to the Z direction displacement detection electrodes comprise at least two metal layers connected by a via; and
   the Y direction displacement detection electrodes comprise two sub-groups of electrodes, each comprising at least two metal layers connected by a via, and the Z direction displacement detection electrodes also comprise two sub-groups of electrodes, each comprising at least two metal layers connected by a via; and
   the power supply module provides a current flowing through the mass block selectively in the X or Y direction.

2. The magnetic field sensor as claimed in claim 1, wherein the via is filled with a metal material.

3. The magnetic field sensor as claimed in claim 1, wherein in the mass block, the portion corresponding to the Y direction displacement detection electrodes and the portion corresponding to the Z direction displacement detection electrodes are in different planes.

4. The magnetic field sensor as claimed in claim 1, wherein in the mass block, the portion corresponding to the Y direction displacement detection electrodes and the portion corresponding to the Z direction displacement detection electrodes are in the same plane and are electrically insulated from each other.

5. The magnetic field sensor as claimed in claim 1, further comprising a detection circuit for calculating magnetism in three directions of X, Y and Z, to a power supply state of the power supply module, a direction of the current from the power supply module flowing through the mass block and an output of the Y direction displacement detection electrodes or the Z direction displacement detection electrodes, wherein the X direction is a direction in a plane where the mass block is arranged and perpendicular to the Y direction.

6. The magnetic field sensor as claimed in claim 1, wherein the Y direction displacement detection electrodes and the Z direction displacement detection electrodes both form, at one side adjacent to the mass block, finger extensions extending in the X/Y plane; and the mass block forms, at a side adjacent to the Y direction displacement detection electrodes and the Z direction displacement detection electrodes, finger extensions which extend in the X/Y plane and into recesses formed by the finger extensions of the Y direction displacement detection electrodes and the Z direction displacement detection electrodes.

7. The magnetic field sensor as claimed in claim 1, wherein the mass block, the Y direction displacement detection electrodes and the Z direction displacement detection electrodes are formed integrally in a structure which is formed by a plurality of metal layers and a plurality of dielectric layers staggered sequentially and the mass block is separated, at an interval of space, from the Y direction displacement detection electrodes and the Z direction displacement detection electrodes.

8. The magnetic field sensor as claimed in claim 7, wherein the Y direction displacement detection electrodes are located in first and second metal layers of the structure; a first sub-group of electrodes of the Y direction detection electrodes includes a plurality of finger electrodes, and a second sub-group of electrodes thereof also comprises a plurality of finger electrodes, with finger electrodes of the two sub-groups being arranged in a staggered configuration, such that a finger electrode pair including a finger electrode of the first sub-group of electrodes and a finger electrode of the second sub-group of electrodes correspond to one of finger extensions of the mass block.

9. The magnetic field sensor as claimed in claim 8, wherein the first and second metal layers of each sub-group of electrodes of the Y direction displacement detection electrodes are connected by a via.

10. The magnetic field sensor as claimed in claim 8, wherein the Z direction displacement detection electrodes are respectively located in the third and fourth metal layers and in the fifth and sixth metal layers of the structure; and the third and fourth metal layers and the fifth and sixth metal layers are located at different heights in the Z direction.

11. The magnetic field sensor as claimed in claim 10, wherein the magnetic field sensor comprises two sets of Z direction displacement detection electrodes, each set of Z direction displacement detection electrodes comprising two sub-groups of electrodes respectively located in the third and fourth metal layers and in the fifth and sixth metal layers of the structure; wherein the third and fourth metal layers are located above the fifth and sixth metal layers.

12. The magnetic field sensor as claimed in claim 11, wherein the first and second metal layers and the third to sixth metal layers maintain a predetermined distance therebetween with at least one dielectric layer.

13. The magnetic field sensor as claimed in claim 11, wherein the third and fourth metal layers of the Z direction displacement detection electrodes are connected by a via and the fifth and sixth metal layers thereof are also connected by a via.

14. The magnetic field sensor as claimed in claim 13, wherein the first and second metal layers of the mass block are connected by a via and the fourth and fifth metal layers are connected by a via.

15. The magnetic field sensor as claimed in claim 7, wherein the magnetic field sensor comprises two sets of Y direction displacement detection electrodes, each set of Y direction displacement detection electrodes comprising two sub-groups of electrodes, both located in a first and a second metal layers of the structure.

16. The magnetic field sensor as claimed in claim 15, wherein the Z direction displacement detection electrodes are respectively located in the third and fourth metal layers and in the fifth and sixth metal layers of the structure; and the third and fourth metal layers and the fifth and sixth metal layers are located at different heights in the Z direction.

17. The magnetic field sensor as claimed in claim 1, wherein the mass block provides at least four contacts for electrical connection to the power supply module, so that the current provided by the power supply module flows through the mass block selectively in the X or Y direction.

18. The magnetic field sensor as claimed in claim 1, wherein the detection circuit is connected to the power supply module and the sub-groups of electrodes of the Y direction displacement detection electrodes and the Z direction displacement detection electrodes, so as to detect in synchronization with the operation of the power supply module a change in capacitance between the Y direction displacement detection electrodes and the portion of the mass block corresponding to the Y direction displacement detection electrodes, to determine a Y direction displacement amount of the mass block under the action of a magnetic field; and to detect in synchronization with the operation of the power supply module a change in capacitance between the Z direction displacement detection electrodes and the portion of the mass block corresponding to the Z direction displacement detection electrode, to determine a Z direction displacement amount of the mass block under the action of a magnetic field.

19. The magnetic field sensor as claimed in claim 18, wherein the detection circuit further calculates magnetism of the magnetic field in X/Y/Z directions, according to a flowing direction of the current and the Y/Z direction displacement amount.

20. The magnetic field sensor as claimed in claim 1, wherein when the power supply module applies an X direction current to the mass block, the detection circuit measures a Z direction displacement amount of the mass block and calculates a Y direction magnetic force on the mass block on this basis; when the power supply module applies an X direction currents to the mass block, the detection circuit measures a Y direction displacement amount of the mass block and calculates a Z direction magnetic force on the mass block on this basis; and when the power supply module applies a Y direction current to the mass block, the detection circuit measures a Z direction displacement amount of the mass block and calculates an X direction magnetic force on the mass block.

* * * * *